(12) United States Patent
Suzuki (10) Patent No.: US 7,598,804 B2
(45) Date of Patent: Oct. 6, 2009

(54) AMPLIFIER CIRCUIT

(75) Inventor: Toshihide Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 59 days.

(21) Appl. No.: 12/022,774

(22) Filed: Jan. 30, 2008

(65) Prior Publication Data

US 2008/0303594 A1 Dec. 11, 2008

(30) Foreign Application Priority Data

Feb. 20, 2007 (JP) ............................. 2007-039674

(51) Int. Cl.
H03F 1/14 (2006.01)
(52) U.S. Cl. ...................................... 330/51; 330/295
(58) Field of Classification Search .................. 330/51, 330/295, 124 R, 84, 126
See application file for complete search history.

(56) References Cited

U.S. PATENT DOCUMENTS

| | | | |
|---|---|---|---|
| 4,825,174 A | | 4/1989 | Vella-Coleiro |
| 5,256,987 A | * | 10/1993 | Kibayashi et al. ............ 330/295 |
| 5,304,943 A | * | 4/1994 | Koontz ......................... 330/51 |
| 6,288,608 B1 | * | 9/2001 | Jadus et al. .............. 330/124 R |
| 6,317,002 B1 | * | 11/2001 | Griffiths ..................... 330/295 |
| 2008/0238550 A1 | * | 10/2008 | Sasaki et al. ................ 330/277 |

FOREIGN PATENT DOCUMENTS

| | | |
|---|---|---|
| JP | 06-132746 A | 5/1994 |
| JP | 07-120904 B2 | 12/1995 |
| JP | 2000-101371 A | 4/2000 |
| JP | 2000-332545 A | 11/2000 |

OTHER PUBLICATIONS

Jin-Han Yoon et al., "A 900 MHz CMOS RF Power Amplifier with Digitally Controllable Output Power"; Proceedings of IEEE Tencon'; Feb. 2002, pp. 1138-1141.

* cited by examiner

Primary Examiner—Henry K Choe
(74) Attorney, Agent, or Firm—Arent Fox LLP.

(57) ABSTRACT

There is provided an amplifier circuit including a plurality of unit amplifiers connected in parallel to an input signal terminal, wherein each of the unit amplifiers includes: a first switch switching an input signal inputted from the input signal terminal; a first field effect transistor having a gate connected to the input signal terminal via the first switch and amplifying the input signal of the input signal terminal to output the amplified input signal; a second switch connected in parallel to the first switch and switching the input signal of the input signal terminal at a complementary timing to a switching timing of the first switch; and a capacitor connected to the input signal terminal via the second switch.

10 Claims, 7 Drawing Sheets

AMPLIFIER CIRCUIT

CROSS-REFERENCE TO RELATED APPLICATIONS

This application is based upon and claims the benefit of priority from the prior Japanese Patent Application No. 2007-039674, filed on Feb. 20, 2007, the entire contents of which are incorporated herein by reference.

BACKGROUND OF THE INVENTION

1. Field of the Invention

The present invention relates to an amplifier circuit.

2. Description of the Related Art

Figure 9:
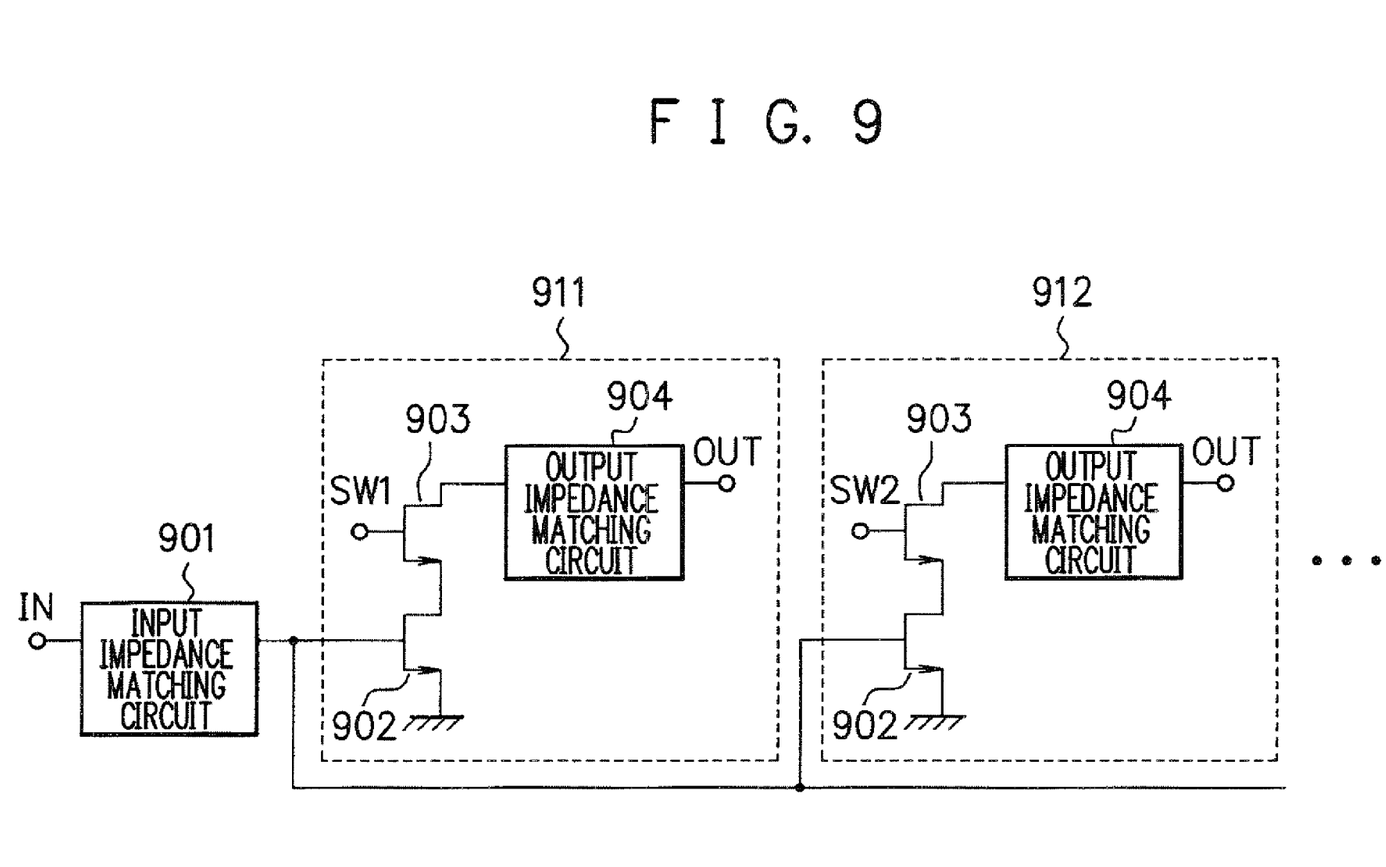
FIG. 9 is a circuit diagram showing a configuration example of a digital power amplifier.

FIG. 9 is a circuit diagram showing a configuration example of a digital power amplifier (see a non-patent document 1). An input signal terminal IN is connected in parallel to a plurality of unit amplifiers 911, 912, . . . via an input impedance matching circuit 901. Each of the unit amplifiers 911, 912, . . . has transistors 902, 903 and an output impedance matching circuit 904. The n-channel field effect transistor 902 has a gate connected to the input signal terminal IN via the input impedance matching circuit 901, and a source connected to a reference potential. The n-channel field effect transistor 903 has a source connected to a drain of the transistor 902, and a drain connected to an output signal terminal OUT via the output impedance matching circuit 904. In the first unit amplifier 911, a gate of the transistor 903 is connected to a switching control signal terminal SW1. In the second unit amplifier 912, a gate of the transistor 903 is connected to a switching control signal terminal SW2.

First, the operation of the first unit amplifier 911 will be described. When the switching control signal terminal SW1 is set to high level, the transistor 903 turns on, and the transistor 902 amplifies an input signal inputted to the input signal terminal IN and outputs the amplified input signal to the output signal terminal OUT. When the switching control signal terminal SW1 is set to low level, the transistor 903 turns off and the transistor 902 does not operate, and therefore no amplified signal is outputted from the output signal terminal OUT.

Next, the operation of the second unit amplifier 912 will be described. When the switching control signal terminal SW2 is set to high level, the transistor 903 turns on and the transistor 902 amplifies the input signal inputted to the input signal terminal IN and outputs the amplified input signal to the output signal terminal OUT. When the switching control signal terminal SW2 is set to low level, the transistor 903 turns off and the transistor 902 does not operate, and therefore no amplified signal is outputted from the output signal terminal OUT.

Control signals of the switching control signal terminals SW1 and SW2 control the operation of the unit amplifiers, whereby an amplification factor of the digital power amplifier can be controlled. Incidentally, since the input signal is a high-frequency RF signal, the impedance matching circuits 901 and 904 are necessary.

To control output power, the digital power amplifier adopts a method depending on the number of the unit amplifiers 911, 912 in operation, instead of depending on input power. A conventional amplifier has a problem that, when an input signal is weak, a ratio of DC bias power for keeping the amplifier in an operating state is high, resulting in low power efficiency. In the digital power amplifier, since the control depends on the number of the unit amplifiers 911, 912 in operation, each of the unit amplifiers operates in a saturated state, and when an input signal is weak, the number of the unit amplifiers 911, 912 in operation is decreased, thereby enabling a reduction in DC bias power. That is, a highly efficient operation is made possible.

[Non-patent document 1] Jin-Han Yoon et al., "A 900 MHz CMOS RF Power Amplifier with Digitally Controllable Output Power", Proceedings of IEEE TENCON' 02, 2002, pp. 1138-1141

The digital power amplifier in FIG. 9 has the two transistors 902 and 903 connected in cascode, and thus requires a high power supply voltage for driving the two transistors 902 and 903, resulting in an increase in DC bias power, which gives rise to the problem that power efficiency is lowered. Further, since a RF signal is inputted to the transistor 902, the RF signal, though only a little, leaks to the output side. In a case where resolution of the digital power amplifier is increased, this leakage power has an adverse effect.

SUMMARY OF THE INVENTION

According to one aspect, there is provided an amplifier circuit including a plurality of unit amplifiers connected in parallel to an input signal terminal, wherein each of the unit amplifiers includes: a first switch switching an input signal inputted from the input signal terminal; a first field effect transistor having a gate connected to the input signal terminal via the first switch and amplifying the input signal of the input signal terminal to output the amplified input signal; a second switch connected in parallel to the first switch and switching the input signal of the input signal terminal at a complementary timing to a switching timing of the first switch; and a capacitor connected to the input signal terminal via the second switch.

DETAILED DESCRIPTION OF THE PREFERRED EMBODIMENTS

First Embodiment

Figure 1:
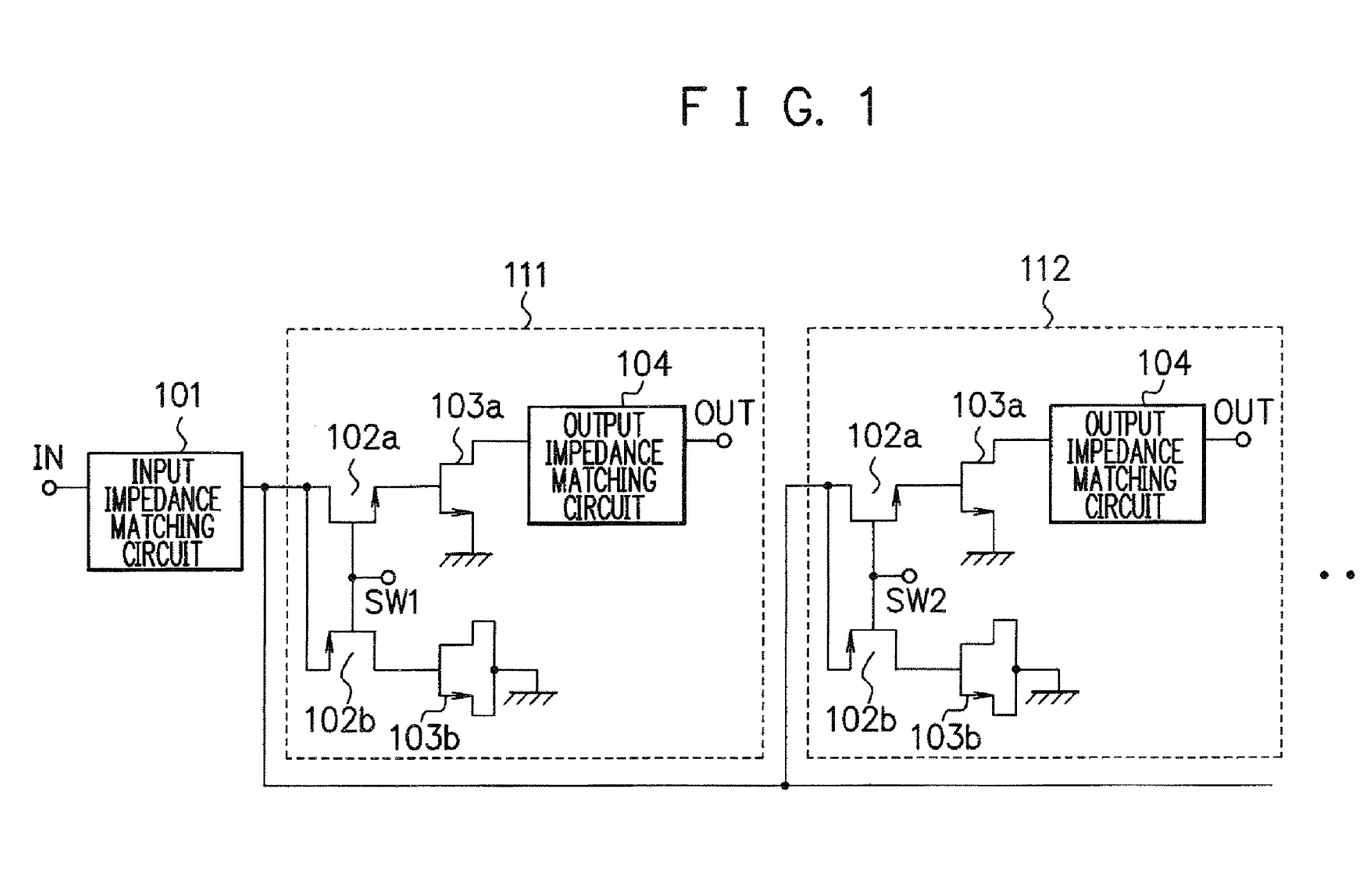
FIG. 1 is a circuit diagram showing a configuration example of an amplifier circuit (digital power amplifier) according to a first embodiment of the present invention.

FIG. 1 is a circuit diagram showing a configuration example of an amplifier circuit (digital power amplifier) according to a first embodiment of the present invention. An input signal terminal IN is connected in parallel to a plurality of unit amplifiers 111, 112, . . . via an input impedance matching circuit 101. Each of the unit amplifiers 111, 112, . . . has transistors 102a, 102b, 103a, 103b and an output impedance matching circuit 104. The n-channel field effect transistor 102a has a drain connected to the input signal terminal IN via the input impedance matching circuit 101. The n-channel field effect transistor 103a has a gate connected to a source of the transistor 102a, a drain connected to an output signal terminal OUT via the output impedance matching circuit 104, and a source connected to a reference potential (ground potential) The p-channel field effect transistor 102b is connected in parallel to the transistor 102a and has a source connected to the input signal terminal IN via the input impedance matching circuit 101. The n-channel field effect transistor 103b has a gate connected to a drain of the transistor 102b, and a source and a drain connected to the reference potential. The transistor 103b is a dummy capacitor connected between the transistor 102b and the reference potential. The transistors 103a and 103b are equal in size. Therefore, the dummy capacitor 103b has capacitance equal to gate capacitance of the transistor 103a. Incidentally, the dummy capacitor 103b may be constituted by a MIM (metal-insulator-metal) capacitor having capacitance equal to the gate capacitance (input capacitance) of the transistor 103a.

In the first unit amplifier 111, a switching control signal terminal SW1 is connected to gates of the transistors 102a and 102b. In the second unit amplifier 112, a switching control signal terminal SW2 is connected to gates of the transistors 102a and 102b. The n-channel transistor 102a is a first switch switching an input signal inputted from the input signal terminal IN. The p-channel transistor 102b is a second switch connected in parallel to the n-channel transistor (first switch) 102a and switching the input signal of the input signal terminal IN at a complementary timing to a switching timing of the transistor 102a. When the transistor 102a is on, the transistor 102b turns off, and when the transistor 102a is off, the transistor 102b turns on. The n-channel transistor 102a and the p-channel transistor 102b are opposite in polarity. Output signals of the output signal terminals OUT of all the unit amplifiers 111, 112, and so on are synthesized.

Figure 2:
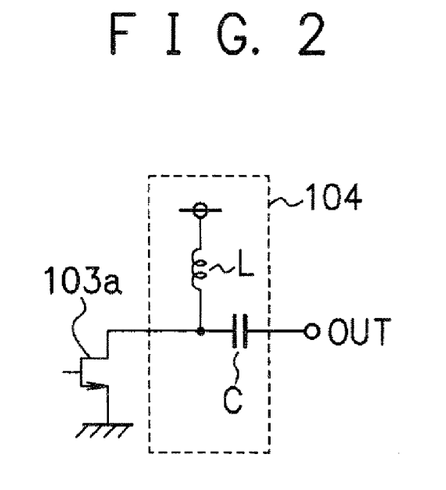
FIG. 2 is a circuit diagram showing a configuration example of an output impedance matching circuit in FIG. 1.

FIG. 2 is a circuit diagram showing a configuration example of the output impedance matching circuit 104 in FIG. 1. An inductor L is connected between a power supply voltage VDD and the drain of the transistor 103a. A capacitor C is connected between the output signal terminal OUT and the drain of the transistor 103a. The input impedance matching circuit 101 also has the same configuration as the output impedance matching circuit 104. The impedance matching by the impedance matching circuits 101 and 104 prevents signal reflection.

Next, the operation of the first unit amplifier 111 will be described. When the switching control signal terminal SW1 is set to high level, the n-channel transistor 102a turns on and the p-channel transistor 102b turns off. The input signal of the input signal terminal IN is outputted to the gate of the transistor 103a via the transistor 102a. The transistor (amplifier) 103a amplifies the input signal inputted to the input signal terminal IN to output the amplified input signal to the output signal terminal OUT. At this time, since the transistor 102b is off, the dummy capacitor 103b is not visible from the input signal terminal IN.

When the switching control signal terminal SW1 is set to low level, the n-channel transistor 102a turns off and the p-channel transistor 102b turns on. The transistor 103a does not operate, and therefore, no amplified signal is outputted from the output signal terminal OUT. The input signal of the input signal terminal IN is outputted to the gate of the transistor (dummy capacitor) 103b via the transistor 102b.

When the switching control signal terminal SW1 is at high level, a load of the input signal terminal IN is the gate capacitance of the transistor 103a. When the switching control signal terminal SW1 is at low level, a load of the input signal terminal IN is the gate capacitance of the transistor (dummy capacitor) 103b. The transistors 103a and 103b are equal in gate capacitance. Therefore, load capacitance of the input signal terminal IN is constant irrespective of whether the switching control signal terminal SW1 is at high level or at low level, and it is possible to maintain the impedance match at both levels, enabling prevention of signal reflection. As a result, high signal transmission efficiency can be maintained.

Next, the operation of the second unit amplifier 112 will be described. The second unit amplifier 112 has the switching control signal terminal SW2 instead of the switching control signal terminal SW1 of the first unit amplifier 111. The operation of the second unit amplifier 112 is the same as the operation of the first unit amplifier 111.

Figure 3:
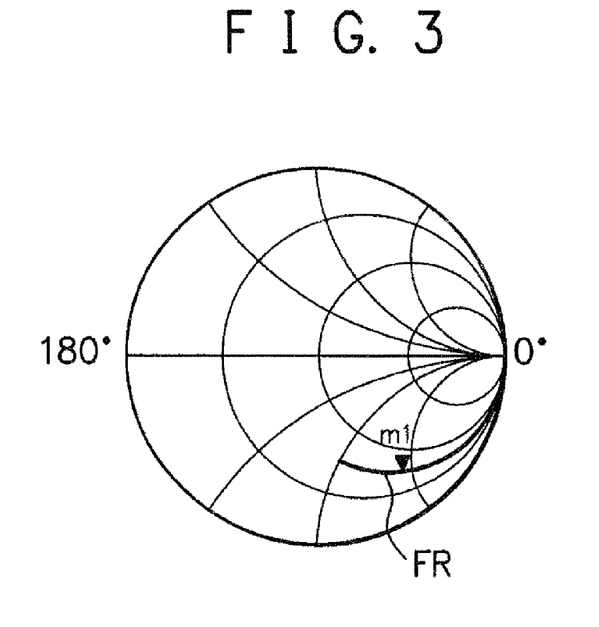
FIG. 3 is a Smith chart of an amplifier circuit without a dummy capacitor when a switching control signal terminal is at high level.
Figure 4:
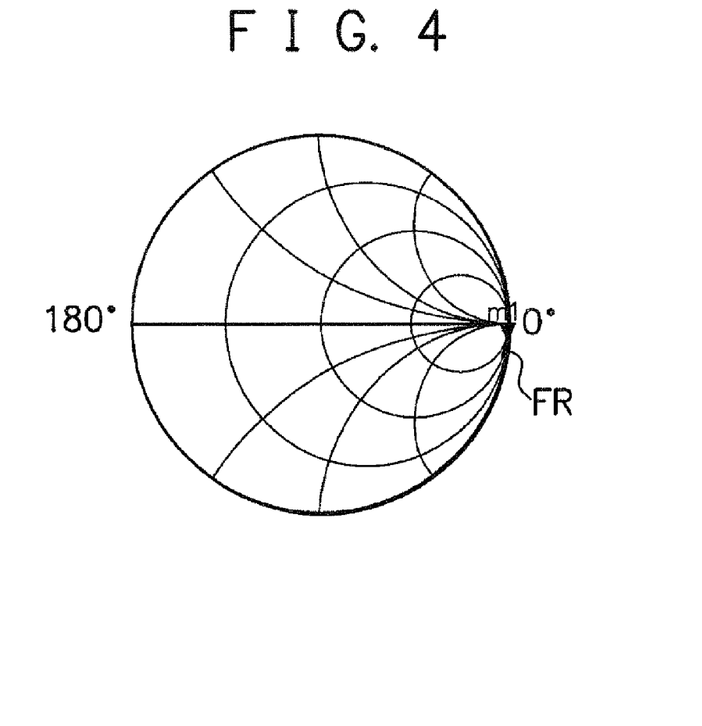
FIG. 4 is a Smith chart of the amplifier circuit without the dummy capacitor when the switching control signal terminal is at low level.
Figure 5:
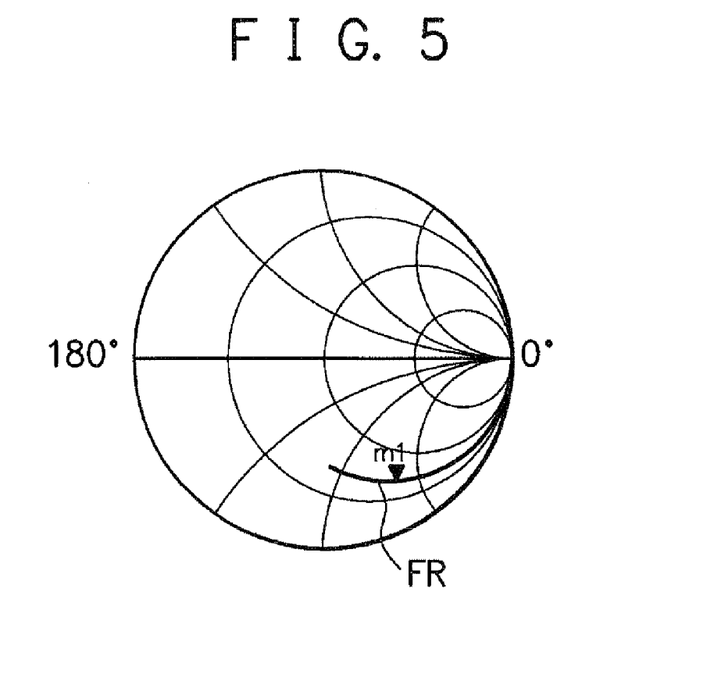
FIG. 5 is a Smith chart of an amplifier circuit with the dummy capacitor in FIG. 1 when the switching control signal terminal is at high level.
Figure 6:
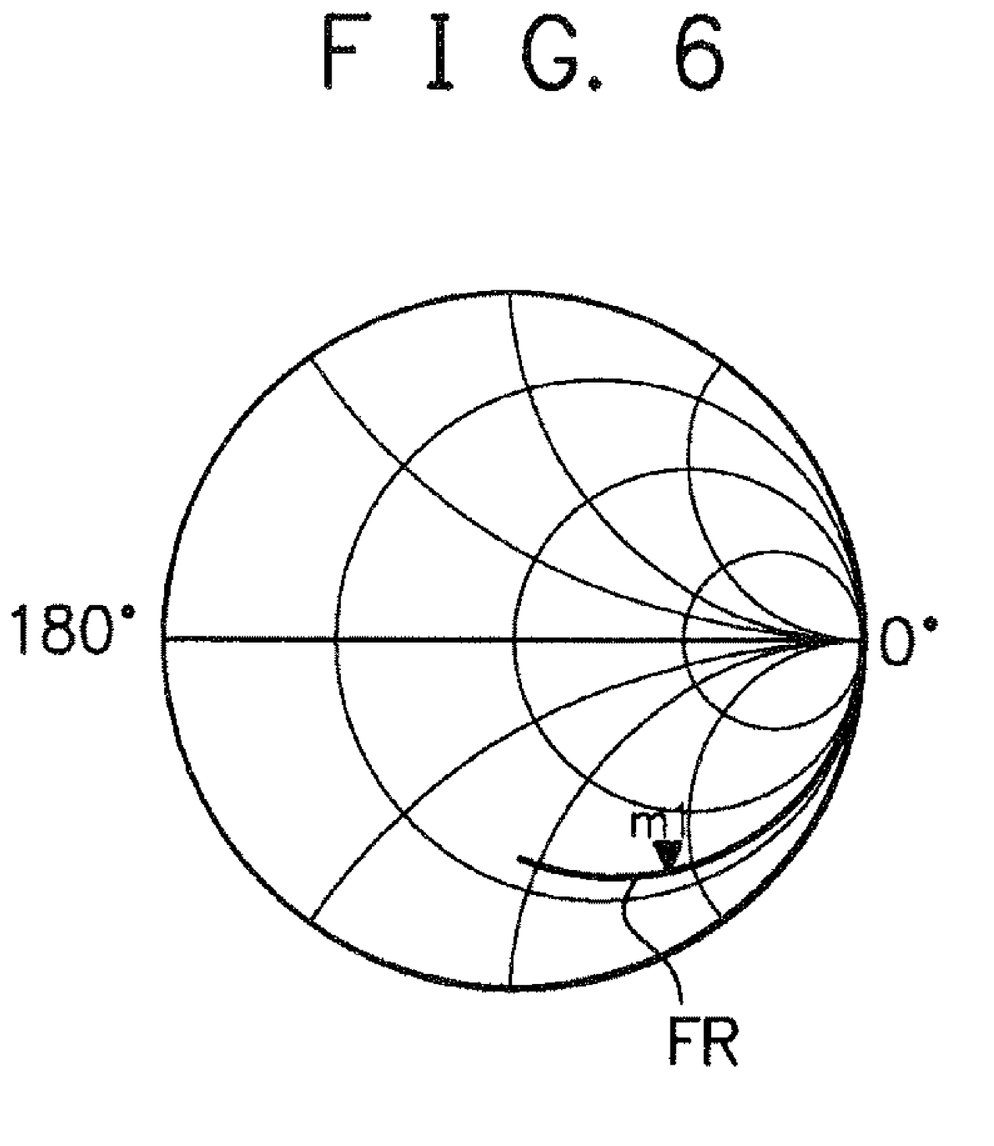
FIG. 6 is a Smith chart of the amplifier with the dummy capacitor in FIG. 1 when the switching control signal terminal is at low level.

Next, an amplifier circuit with the dummy capacitor 103b and an amplifier circuit without the dummy capacitor 103b will be compared. FIG. 3 and FIG. 4 are Smith charts of the amplifier circuit without the dummy capacitor 103b. FIG. 5 and FIG. 6 are Smith charts of the amplifier circuit with the dummy capacitor 103b in FIG. 1.

At the right end of the circle in each of the Smith charts, a phase angle of a reflection coefficient is 0° and at the left end of the circle of each of the Smith charts, the phase angle of the reflection coefficient is 180°. The counterclockwise direction represents a positive phase angle and the clockwise direction represents a negative phase angle. Further, a distance from the center of the circle of the Smith chart is an absolute value of the reflection coefficient. At the center point of the circle, the absolute value of the reflection coefficient is 0, and on the circle, the absolute value of the reflection coefficient is 1. Each characteristic FR represents a characteristic when the frequency of the input signal of the input signal terminal IN is varied. Points m1 represent the reflection coefficients at the same given frequency on the respective characteristics FR.

FIG. 3 is a Smith chart of the amplifier circuit without the dummy capacitor 103b when the switching control signal terminal SW1 is at high level. The reflection coefficient at Point m1 presents a 0.753 absolute value and a −52.57° phase angle.

FIG. 4 is a Smith chart of the amplifier circuit without the dummy capacitor 103b when the switching control signal terminal SW1 is at low level. The reflection coefficient at Point m1 presents a 0.997 absolute value and a −5.087° phase angle.

Without the dummy capacitor 103b, the reflection coefficient greatly changes depending on whether the switching control signal terminal SW1 is at high level (FIG. 3) or at low level (FIG. 4), which causes impedance mismatch. As a result, signal reflection occurs, resulting in deteriorated amplification efficiency.

FIG. 5 is a Smith chart of the amplifier circuit with the dummy capacitor 103b when the switching control signal terminal SW1 is at high level. The reflection coefficient at Point m1 presents a 0.759 absolute value and a −56.60° phase angle.

FIG. 6 is a Smith chart of the amplifier circuit with the dummy capacitor 103b when the switching control signal terminal SW1 is at low level. The reflection coefficient at Point m1 presents a 0.800 absolute value and a −54.89° phase angle.

With the dummy capacitor 103b, the reflection coefficient is substantially the same irrespective of whether the switching control signal terminal SW1 is at high level (FIG. 5) or at low level (FIG. 6), and impedance match can be maintained. As a result, signal reflection does not occur, resulting in increased amplification efficiency.

Figure 7:
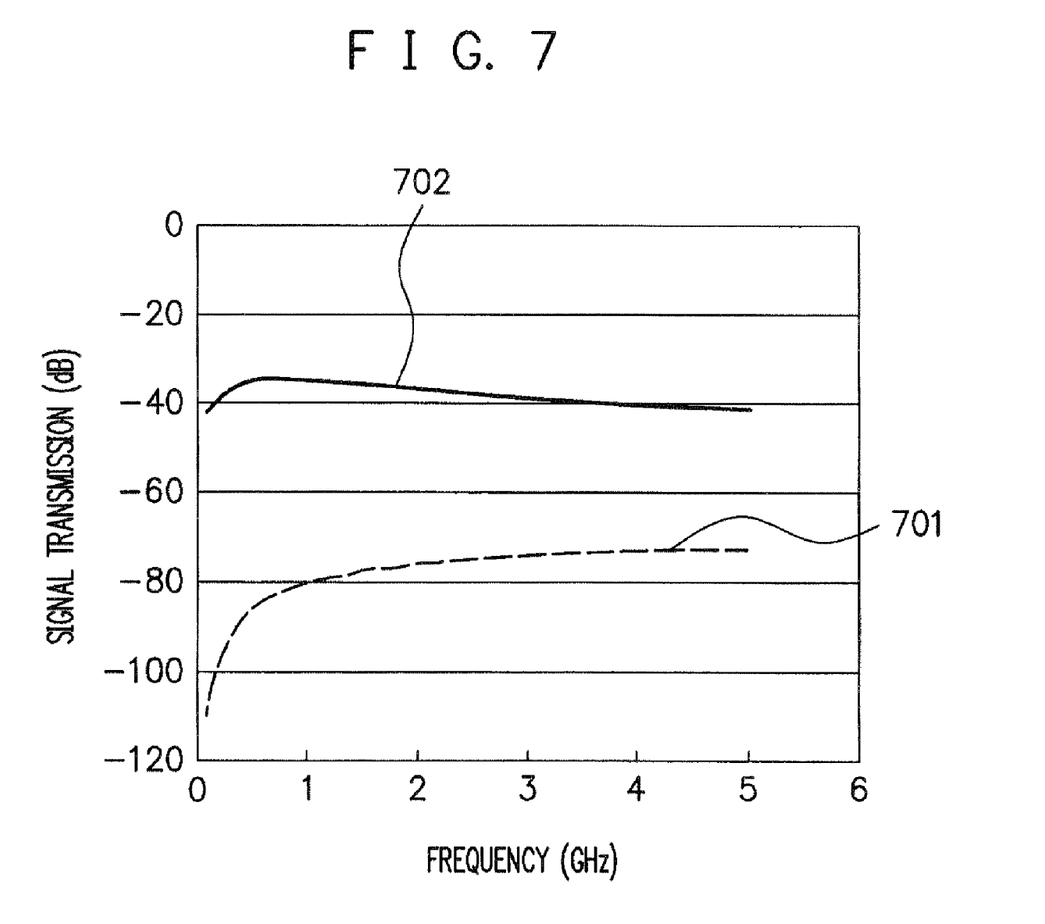
FIG. 7 is a graph showing a relation between frequency and signal transmission [dB]

FIG. 7 is a graph showing a relation between frequency and signal transmission [dB]. The characteristic 701 represents a characteristic when the switching control signal terminal SW1 is set to low level in the amplifier circuit in FIG. 1. The characteristic 702 represents a characteristic when the switching control signal terminal SW1 is set to low level in the amplifier circuit in FIG. 9. If the switching control signal terminal SW1 is set to low level, an output signal should be theoretically zero (0). Actually, however, a high-frequency signal of the input signal terminal IN leaks to the output signal terminal OUT. The signal transmission [dB] on the vertical axis represents a ratio of leakage power of the output signal to power of the input signal. The leakage power presented by the characteristic 701 is smaller by 30 dB or more than that presented by the characteristic 702. In the amplifier circuit in FIG. 1, the leakage of the input RF signal to the output signal terminal OUT is smaller and signal shielding level is higher than those in the amplifier circuit in FIG. 9. Therefore, the digital power amplifier of this embodiment can prevent an adverse effect of the leakage power especially when resolution is increased.

In the amplifier circuit in FIG. 9, since the two transistors 902 and 903 are connected in cascode, a high power supply voltage for driving the two transistors 902 and 903 are necessary and consequently DC bias power is increased, resulting in deteriorated power efficiency. On the other hand, in the amplifier circuit of this embodiment (FIG. 1), since the one transistor 103a is connected between the power supply voltage VDD and the reference potential, a low power supply voltage that suffices for driving the one transistor 103a can be used, which reduces DC bias power, resulting in improved power efficiency. In the amplifier circuit of this embodiment, a low power supply voltage that is about ½ of that in the amplifier circuit in FIG. 9 can be used.

Second Embodiment

Figure 8:
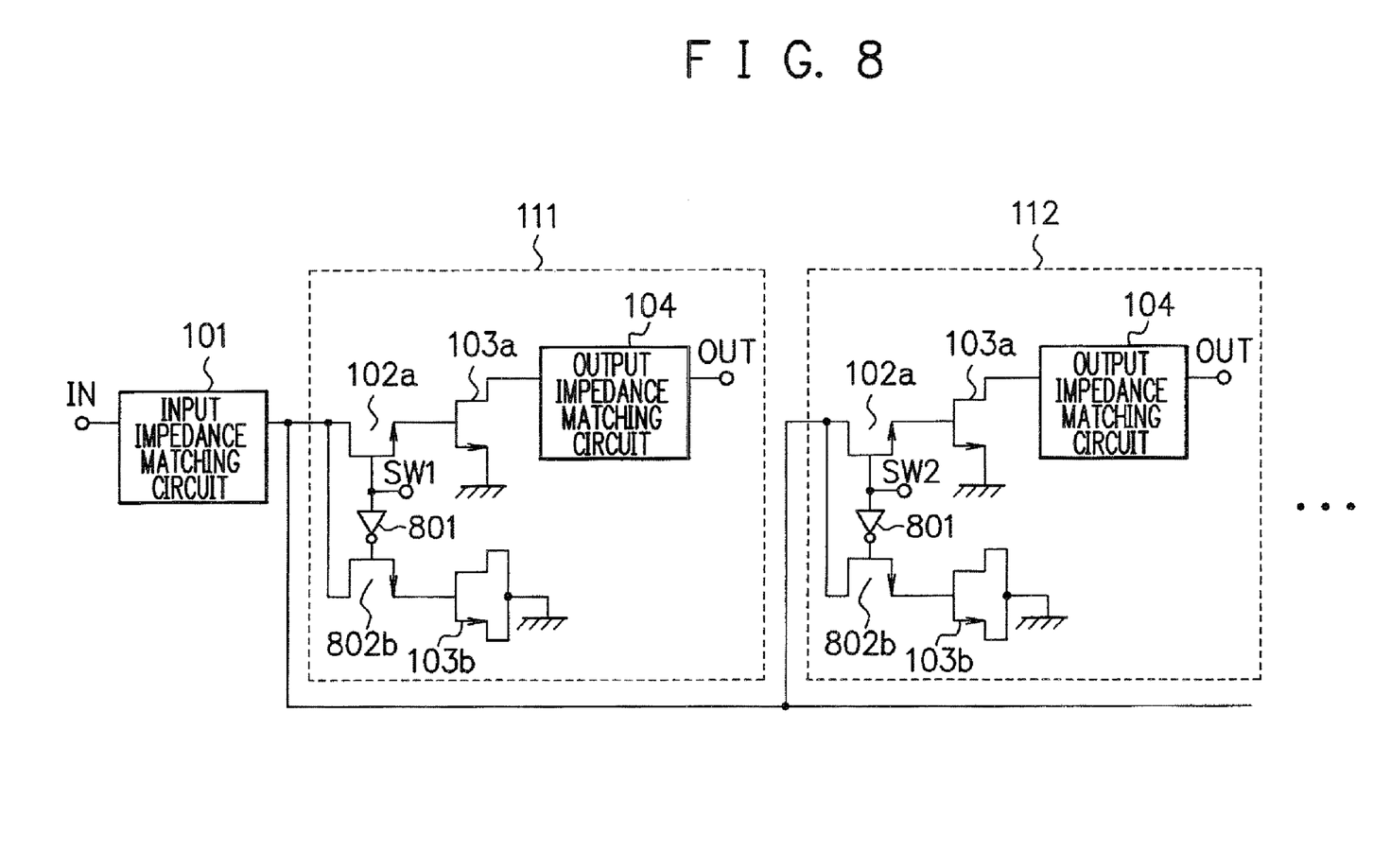
FIG. 8 is a circuit diagram showing a configuration example of an amplifier circuit (digital power amplifier) according to a second embodiment of the present invention.

FIG. 8 is a circuit diagram showing a configuration example of an amplifier circuit (digital power amplifier) according to a second embodiment of the present invention. This embodiment (FIG. 8) is configured such that in the first embodiment (FIG. 1), an n-channel field effect transistor 802b is provided instead of the p-channel field effect transistor 102b, and an inverter 801 is added. Hereinafter, what makes this embodiment different from the first embodiment will be described. This embodiment is the same as the first embodiment in other respects.

In a unit amplifier 111, the n-channel field effect transistor 802b has a gate connected to a switching control signal terminal SW1 via the inverter 801, a drain connected to an input signal terminal IN via an input impedance matching circuit 101, and a source connected to a gate of a transistor (dummy capacitor) 103b.

In a unit amplifier 112, the n-channel field effect transistor 802b has a gate connected to a switching control signal terminal SW2 via the inverter 801, a drain connected to an input signal terminal IN via an input impedance matching circuit 101, and a source connected to a gate of a transistor (dummy capacitor) 103b.

The inverter 801 outputs a signal of the switching control signal terminal SW1 or SW2 by inverting its logic. Therefore, as in the first embodiment, the transistor (switch) 802b switches an input signal of the input signal terminal IN at a complementary timing to a switching timing of the transistor 102a. When the transistor 102a is on, the transistor 802b turns off, and when the transistor 102a is off, the transistor 802b turns on. The n-channel transistors 102a and 802b are equal in polarity. The operation of this embodiment is the same as the operation of the first embodiment.

As described above, each of the amplifier circuits of the first and second embodiments has the plural unit amplifiers 111, 112, . . . connected in parallel to the input signal terminal IN. Each of the unit amplifiers has: the first switch 102a switching the input signal inputted from the input signal terminal IN; the first field effect transistor 103a having the gate connected to the input signal terminal IN via the first switch 102a and amplifying the input signal of the input signal terminal IN to output the amplified input signal; the second switch 102b or 802b connected in parallel to the first switch 102a and switching the input signal of the input signal terminal IN at a complementary timing to a switching timing of the first switch 102a; and the capacitor 103b connected to the input signal terminal IN via the second switch 102b or 802b.

In the amplifier circuit in FIG. 9, the transistors 902 and 903 are connected in cascode, but in this embodiment, on the other hand, since the transistor 103a is not connected in cascode, the power supply voltage VDD supplied to the transistor 103a can be made low. Consequently, DC bias is reduced, enabling improved power efficiency Further, as contrast to the amplifier circuit in FIG. 9, this embodiment can prevent leakage power from the high-frequency input signal to the output signal terminal. Further, providing the dummy capacitor 103b makes it possible to prevent the input RF signal from being reflected due to a change in level of the switching control signal terminal SW1 or SW2.

Since the first field effect transistor is not connected in cascode, a power supply voltage supplied to the first field effect transistor can be made low. Consequently, DC bias is reduced, enabling improved power efficiency. Further, leakage power from a high-frequency input signal to the output signal terminal can be prevented.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An amplifier circuit comprising a plurality of unit amplifiers connected in parallel to an input signal terminal,
    wherein each of said unit amplifiers comprises:
    a first switch switching an input signal inputted from the input signal terminal;

a first field effect transistor having a gate connected to the input signal terminal via said first switch and amplifying the input signal of the input signal terminal to output the amplified input signal;

a second switch connected in parallel to said first switch and switching the input signal of the input signal terminal at a complementary timing to a switching timing of said first switch; and a capacitor connected to the input signal terminal via said second switch.

2. The amplifier circuit according to claim 1, wherein said capacitor is a second field effect transistor having a gate connected to the input signal terminal via said second switch.

3. The amplifier circuit according to claim 2, wherein said first and second field effect transistors are equal in size.

4. The amplifier circuit according to claim 2, wherein a source and a drain of said second field effect transistor are connected to a reference potential.

5. The amplifier circuit according to claim 1, wherein said capacitor has capacitance equal to gate capacitance of said first field effect transistor.

6. The amplifier circuit according to claim 1, wherein said capacitor is connected between said second switch and a reference potential.

7. The amplifier circuit according to claim 2, wherein said first switch is a third field effect transistor, and said second switch is a fourth field effect transistor.

8. The amplifier circuit according to claim 7, wherein said third and fourth field effect transistors are opposite in polarity to each other.

9. The amplifier circuit according to claim 7, wherein said third and fourth field effect transistors are equal in polarity to each other.

10. The amplifier circuit according to claim 1, wherein a drain of said first field effect transistor is connected to an output signal terminal via an impedance matching circuit.

* * * * *